(12) United States Patent
Ikushima

(10) Patent No.: US 8,365,385 B2
(45) Date of Patent: Feb. 5, 2013

(54) PROCESSING APPARATUS AND METHOD

(75) Inventor: Kazumasa Ikushima, Mitaka (JP)

(73) Assignee: Musashi Engineering, Inc., Tokyo (JP)

( * ) Notice: Subject to any disclaimer, the term of this patent is extended or adjusted under 35 U.S.C. 154(b) by 901 days.

(21) Appl. No.: 12/096,389

(22) PCT Filed: Dec. 6, 2006

(86) PCT No.: PCT/JP2006/324785
§ 371 (c)(1),
(2), (4) Date: Sep. 4, 2008

(87) PCT Pub. No.: WO2007/066808
PCT Pub. Date: Jun. 14, 2007

(65) Prior Publication Data
US 2009/0000112 A1    Jan. 1, 2009

(30) Foreign Application Priority Data
Dec. 6, 2005   (JP) .................................. 2005-352494

(51) Int. Cl.
*B23P 11/00*   (2006.01)
(52) U.S. Cl. ................. 29/429; 29/739; 29/740; 29/742; 29/759; 29/841; 438/25; 438/112; 438/106; 438/781; 222/146.1
(58) Field of Classification Search .............. 29/739, 29/740, 742, 759, 429, 841; 438/15, 112, 438/106, 781; 222/146.1
See application file for complete search history.

(56) References Cited

U.S. PATENT DOCUMENTS

| | | | |
|---|---|---|---|
| 4,970,764 A | | 11/1990 | Trias |
| 4,970,765 A | | 11/1990 | Sakawa et al. |
| 5,976,258 A | * | 11/1999 | Kleiner ........................ 118/718 |
| 6,197,612 B1 | * | 3/2001 | Watanabe ..................... 438/106 |
| 6,225,144 B1 | * | 5/2001 | How et al. .................... 438/106 |
| 6,998,278 B2 | * | 2/2006 | Silverbrook .................... 438/21 |

(Continued)

FOREIGN PATENT DOCUMENTS

| | | |
|---|---|---|
| JP | 1-97541 | 4/1989 |
| JP | 3-281082 | 12/1991 |

(Continued)

OTHER PUBLICATIONS

English language Abstract of JP 1-97451, Apr. 17, 1989.

(Continued)

*Primary Examiner* — A. Dexter Tugbang
*Assistant Examiner* — Azm Parvez
(74) *Attorney, Agent, or Firm* — Greenblum & Bernstein P.L.C.

(57) ABSTRACT

There is provided a work processing apparatus including a plurality of work conveyance lines on which works are to be moved, a stopping unit to stop a work in a predetermined processing position on each of the work conveyance lines, a processing unit to make a desired process on the work stopped by the stopping unit, and a moving unit to move the processing unit between the work conveyance lines. Works are sequentially processed on the plurality of work conveyance lines. While a work is being processed in the processing position on one of the work conveyance lines, another work can be carried in to the other work conveyance line. Therefore, immediately after a work is completely processed on the one work conveyance line, processing of another work can be started. As a result, the production rate is higher and the apparatus can be designed smaller in size.

25 Claims, 9 Drawing Sheets

U.S. PATENT DOCUMENTS

| | | | |
|---|---|---|---|
| 7,621,969 B2 * | 11/2009 | Masumoto et al. | 29/25.01 |
| 7,676,907 B2 * | 3/2010 | Nies | 29/740 |
| 2005/0161846 A1 * | 7/2005 | Quinones et al. | 264/6 |
| 2008/0304941 A1 * | 12/2008 | Morita et al. | 414/196 |
| 2009/0308860 A1 * | 12/2009 | Baccini | 219/618 |
| 2010/0118285 A1 * | 5/2010 | Miyazaki | 355/30 |
| 2010/0189904 A1 * | 7/2010 | Saito | 427/372.2 |
| 2010/0266782 A1 * | 10/2010 | Langlois | 427/521 |
| 2011/0143481 A1 * | 6/2011 | Pavol et al. | 438/61 |
| 2012/0048192 A1 * | 3/2012 | Little | 118/694 |
| 2012/0052202 A1 * | 3/2012 | Little | 427/248.1 |
| 2012/0060758 A1 * | 3/2012 | Feldman-Peabody et al. | 118/696 |

FOREIGN PATENT DOCUMENTS

| | | |
|---|---|---|
| JP | 03281082 A * | 12/1991 |
| JP | 2001-79483 | 3/2001 |
| JP | 2003-133345 | 5/2003 |
| JP | 2004-154850 | 6/2004 |
| JP | 2005-307353 | 11/2005 |

OTHER PUBLICATIONS

English language Abstract of JP 3-281082, Dec. 11, 1991.
English language Abstract of JP 2001-79483, Mar. 27, 2001.
English language Abstract of JP 2005-307353, Nov. 4, 2005.
English language Abstract of JP 2003-133345, May 9, 2003.
English language Abstract of JP 2004-154850, Jun. 3, 2004.

* cited by examiner

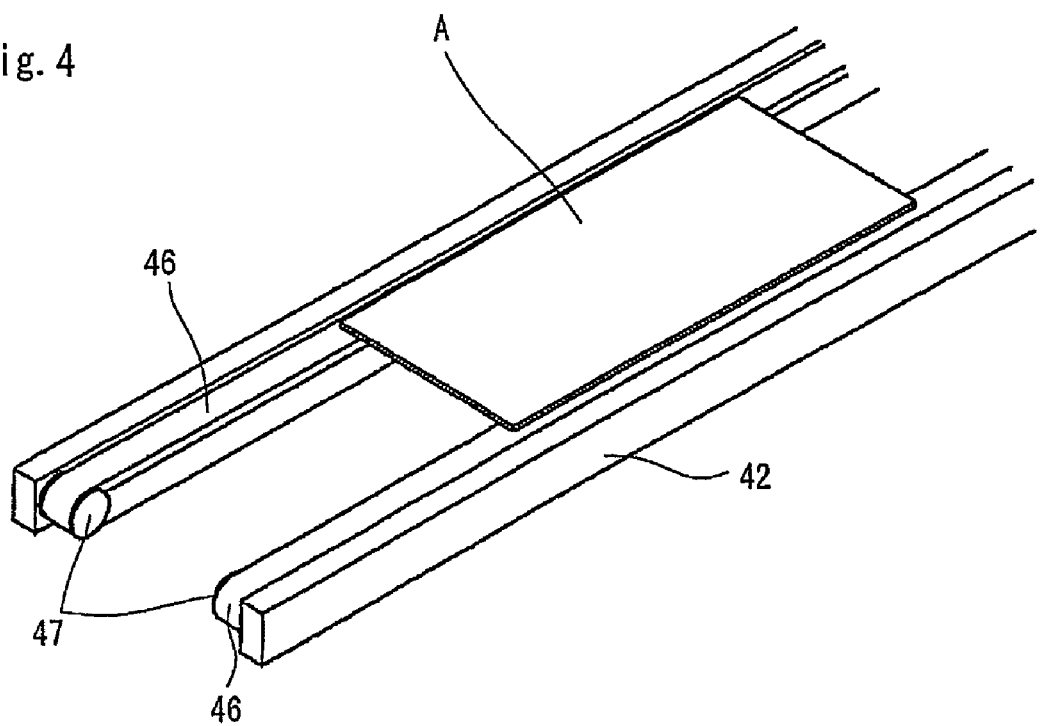

Fig. 5(a) Step 1
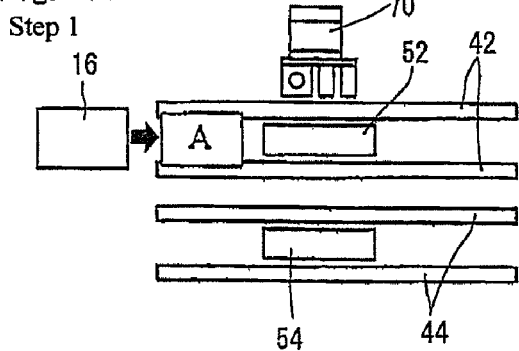
Fig. 5(b) Step 2
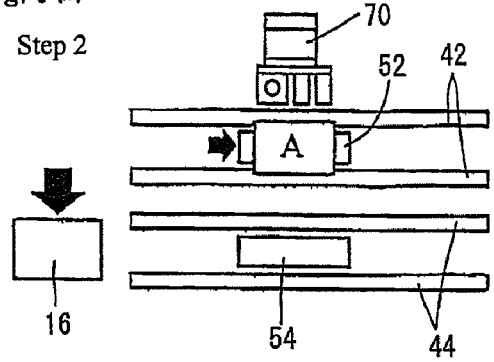
Fig. 5(c) Step 3
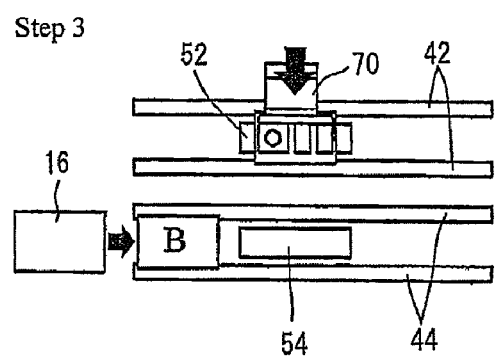
Fig. 5(d) Step 4
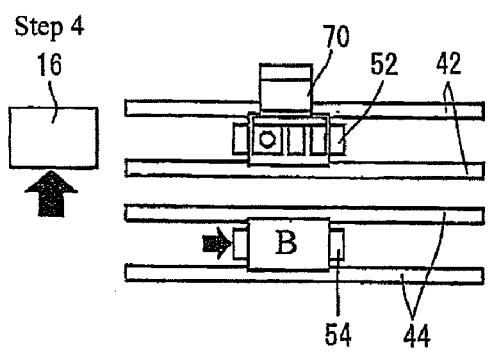
Fig. 5(e) Step 5
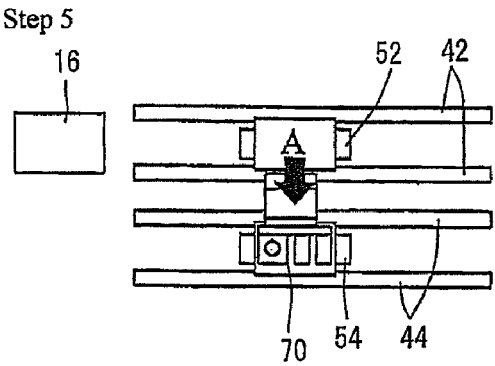
Fig. 5(f) Step 6
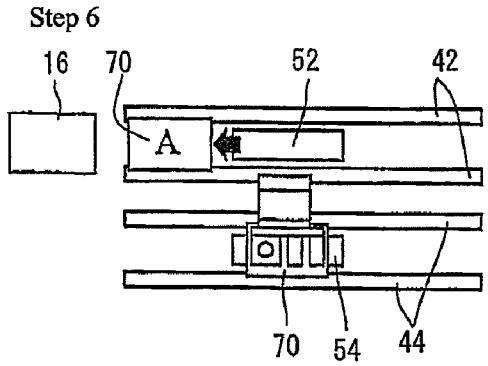

Fig. 6(a) Step 7
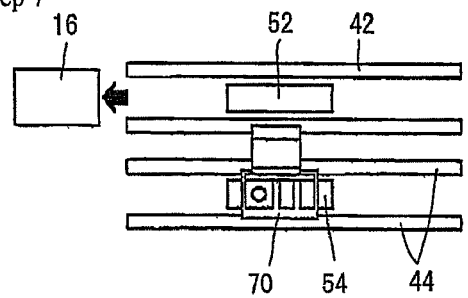
Fig. 6(b) Step 8
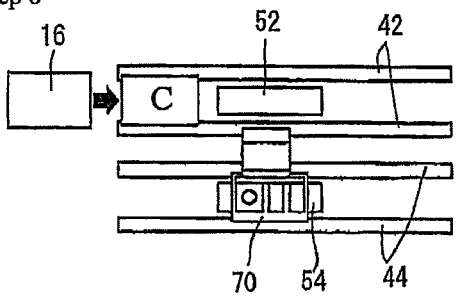
Fig. 6(c) Step 9
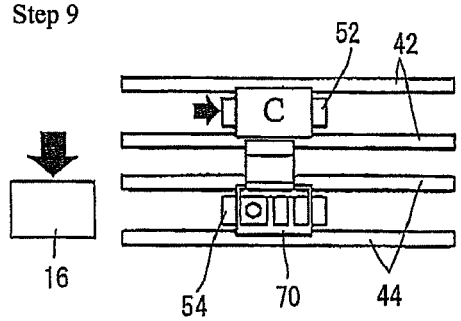
Fig. 6(d) Step 10
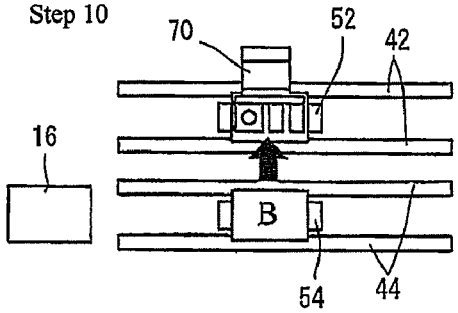
Fig. 6(e) Step 11
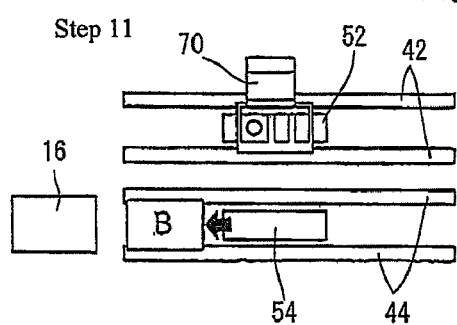
Fig. 6(f) Step 12
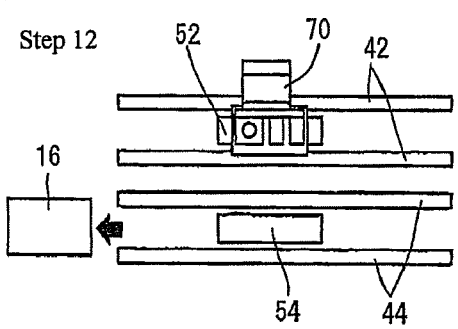
Fig. 6(g) Step 13
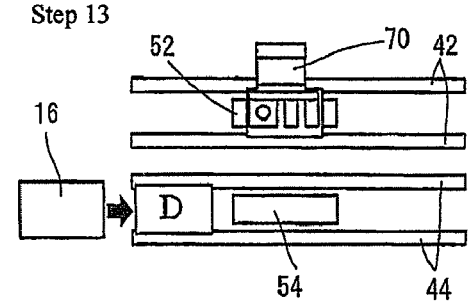

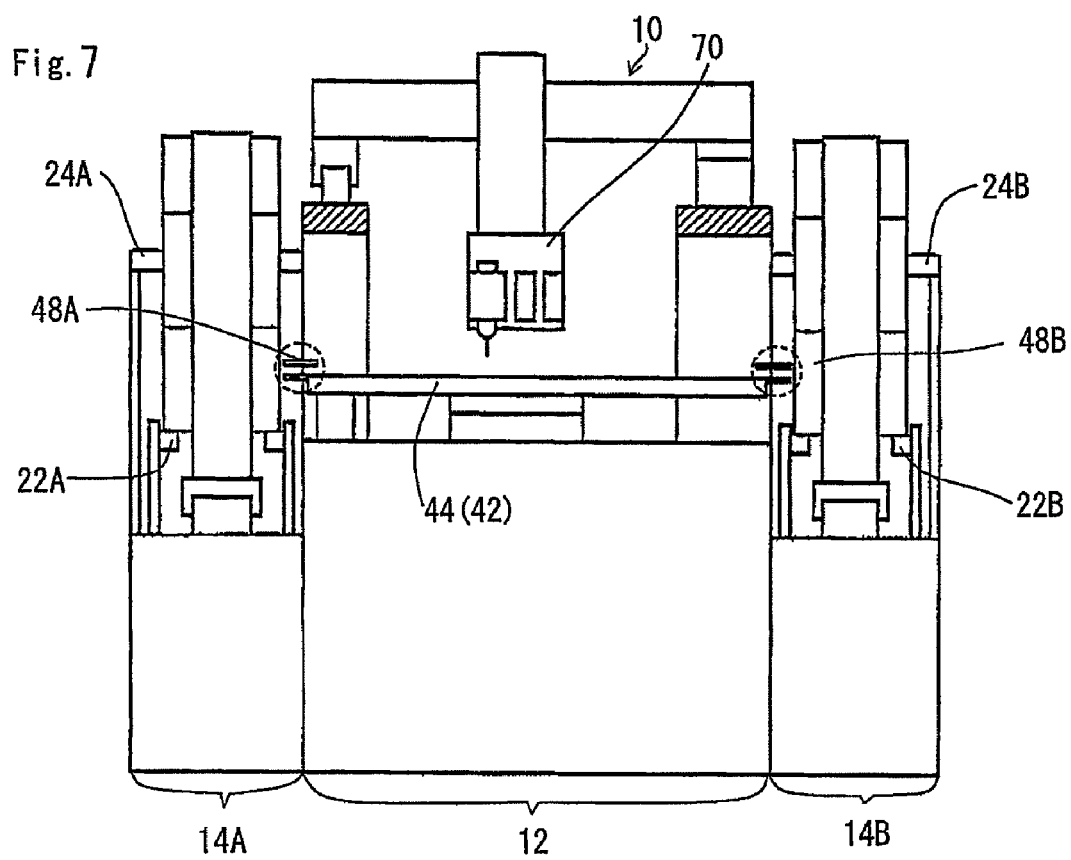

PRIOR ART

PROCESSING APPARATUS AND METHOD

TECHNICAL FIELD

The present invention relates to a processing apparatus and method for coating, mounting, machining, cutting, drilling, etc. (will be generically referred to as "processing" hereunder wherever appropriate) of a workpiece being moved on a conveyance line for the purposes of bonding, protection, filling, electrical continuity, etc.

BACKGROUND ART

The processing apparatuses of the above types include, for example, an apparatus for applying a liquid material to a desired spot on a workpiece (will be referred to simply as "work" hereunder) being moved on a conveyance line or moving the liquid material applied to such a desired spot owing to its fluidity to provide a desired state, such as an apparatus for applying a liquid resin as an underfill material or filler, a mounting apparatus for mounting an electronic part on a substrate, an apparatus for drilling a work with a drill, machining a work, cutting a work with a saw or otherwise processing a work.

More particularly, in the assembling process, for example, included in a series of semiconductor producing processes, a liquid material is discharged from a nozzle to a desired spot on a work for bonding, protection, filling, electrical continuity or the like of the work. In a typical manner, the liquid material is discharged from the nozzle to a predetermined spot on the work and then let to run down owing to its fluidity. In filling an underfill material such as a liquid material, for example, in the process of semiconductor production, the underfill material is let to flow down into a clearance between a semiconductor mounted on a substrate and the substrate, which is the "underfill" operation, and then it is hardened there for reinforcing the semiconductor. That is, in this process, the underfill material applied from a nozzle first to one side of the semiconductor mounted on the substrate flows into, and fills, the clearance between the semiconductor and substrate. Then, the work is placed in an oven or the like to heat the underfill material filled in the clearance. The underfill material is thus hardened to reinforce the semiconductor.

In another typical manner in the semiconductor producing processes, a semiconductor mounted on a substrate is entirely covered with a liquid resin for protection of the semiconductor, which is the so-called "application by sealing". In such a coating process, the liquid resin applied from above to the semiconductor mounted on the substrate by the use of a nozzle will flow over the outer surface of the semiconductor and cover the semiconductor as a whole. Thereafter, the work is placed in an oven to heat the liquid resin similarly to the underfill material. The resin is thus hardened to seal the semiconductor as a whole.

Also in other than the semiconductor production, a resin material is applied, by pouring, to a part having a concavity to fill the concavity. In various industrial fields, a liquid material is applied from a nozzle to a desired spot on a work having a concavity and then let to run down into the concavity owing to its fluidity.

In this type of application, the liquid material should preferably be let to run down into the concavity in a work in a reduced time to attain an improved production efficiency. For example, in case a work is to be applied with a liquid resin material of which the fluidity varies depending upon the temperature, it is heated to a desired temperature for increasing the fluidity of the resin material.

A typical one of such conventional application apparatuses is schematically illustrated in FIG. 10.

As shown in FIG. 10, the application apparatus, generally indicated with a reference numeral 100, includes a applying section 102, a loading section 104 that moves a supply magazine 110 containing a plurality of works to one side of the applying section 102, takes one of the works A out of the supply magazine 110 and puts the work A onto a work conveyance line 112 of the applying section 102, and an unloading section 106 that picks up the work A having been applied in the applying section 102 from on the other side of the latter and puts it into a take-up magazine 114.

The supply magazine 110 contains the plurality of works A in such a manner that one of them can be taken out and conveyed more easily. It is constructed as shown in FIG. 9, for example. A work A to be applied is taken out of the supply magazine 110 and applied by an application head B including a liquid discharging nozzle etc. in a processing position P in the middle of the work conveyance line 112. The work A having thus been applied is taken up and housed into the take-up magazine 114.

Namely, in the liquid application apparatus 100 shown in FIG. 10, the work A taken out of the supply magazine 110 of the loading section 104 is moved to the processing position P provided nearly in the middle of the work conveyance line 112, applied in a predetermined manner, then moved in one direction on the work conveyance line 112, and taken up and housed in the take-up magazine 114 of the unloading section 106.

The work A carried on the work conveyance line 112 from the loading section 104 toward the processing position P is stopped to stay in a before-processing wait position Q before arriving at the processing position P. It will take time in case a next to-be-applied work A is to be supplied from the supply magazine 110 to the processing position P after a preceding work A having been applied in the processing position P is carried in the unloading section 106. By having the next to-be-applied work A stay in the before-processing wait position Q while the preceding work A is being applied in the processing position P as above, it is possible to carry the next work A to the processing position P in a reduced time.

The work A carried on the conveyance line 112 from the processing position P toward the unloading section 106 is stopped to stay in an after-processing wait position R for a while before arriving at the unloading section 106. Namely, in case a work A having been applied in the processing position P is to be housed directly in the take-up magazine 114 of the unloading section 106, it will take time for the work A to leave the processing position P. By having the applied work A move to the after-processing wait position R and stay there as above, it is possible to let the work A having been applied in the processing position P leave this position P in a reduced time.

Especially in case a liquid material is applied to a work and then let to flow down in a concavity in the work owing to its fluidity to have a desired state of application, the fluidity is increased by adjusting the temperature of the liquid material to reduce the working time or the temperature of the liquid material is adjusted with a higher accuracy by adjusting the temperature of a work to which the liquid material is to be applied. For example, a heater is put into touch with the work A from below in the processing position P to adjust the work temperature (main temperature adjustment). Otherwise, the heater is put into touch with the work A from below also in the before-processing wait position Q (temperature adjustment before processing), and then in the processing position P (main temperature adjustment). The manner of work temperature adjustment before processing makes it unnecessary to wait until the work A in the processing position P reaches a desired temperature, which leads to a reduction of the production time.

Also, by adjusting the work temperature with the heater being put in touch with the work A from below in the after-processing wait position R as well (temperature adjustment after processing), the work A can be carried out from the processing position P without having to wait until the applied liquid material completely spreads into a desired shape, which also leads to a reduction of the time up to start of the coating of a next work A.

In addition to the aforementioned liquid-material application apparatus, there has been proposed an apparatus for sealing a semiconductor with a resin as disclosed in the Japanese Published Unexamined Patent Application No. 2003-133345. In a processing position in this semiconductor resin-sealing apparatus, there is made no application but a transfer molding in which a work is formed by pressing a mold filled with a resin to the work from either side of the latter. However, this apparatus is basically similar to the aforementioned liquid application apparatus in that a work (wiring board) is taken out of a magazine, moved on a conveyance line, formed and then housed into the magazine.

It should be noted that in the conventional processing apparatus such as the liquid application apparatus, resin-sealing apparatus or the like, it is necessary to move a work A having been applied or sealed in the processing position P from this position P to the after-processing wait position R before a next to-be-applied or -sealed work A staying in the before-processing wait position Q is moved to the processing position P for applying or sealing. Further in such an apparatus, the work having been moved to the processing position P has to be positioned and fixed against misalignment during processing. Therefore, transition from completion of processing of one work to start of processing of a next work takes time. That is, the production rate cannot be improved.

Also, since the work processed as above is finally a product and should be handled carefully against breakage, excessive reduction of the moving time will be rather a problem to reliability assurance of the final product.

Also, for a conveyance rate as high as possible, the before-processing wait position Q and after-processing wait position R should be provided on the work conveyance line in addition to the processing position P. Thus, the entire processing apparatus will be larger in size since such positions lead to requirement of a correspondingly wider space.

Further, since the loading and unloading sections have to be provided at one and other ends, respectively, of the processing apparatus, so the entire processing system including the processing apparatus is larger in size.

Moreover, in case it is necessary to adjust the temperature of works, a temperature controller or heater has to be provided in each of the before-processing wait position Q, processing position P and after-processing wait position R. Thus, the power consumption of the processing apparatus is larger, and heat will stay inside the apparatus to have adverse influence on the mechanical parts and electronic parts that drive the apparatus.

The present invention is to overcome the above-mentioned drawbacks of the related art by providing a processing apparatus and method improved in production rate, the apparatus being reducible in size.

DISCLOSURE OF THE INVENTION

The inventors of the present invention devoted themselves to the research and development for implementation of the above processing apparatus and method. As a result, the inventors found that with a plurality of work conveyance lines being provided for processing works on the plurality of conveyance lines sequentially, a work can be carried into place on one of the work conveyance lines while a preceding work is being processed in the processing position on the other work conveyance line so that immediately after the preceding work is processed on the other work conveyance line, the work on the one work conveyance line can start being processed. The inventors completed the present invention as will be described below:

Namely, according to an embodiment of the present invention, there is provided a work processing apparatus including a plurality of work conveyance lines on which works are to be moved, a stopping device for stopping a work in a predetermined processing position on each of the work conveyance lines, a processing device for making a desired process on the work stopped by the stopping device, and a moving device for moving the processing device between the work conveyance lines, wherein the processing device includes an applicator having a nozzle that discharges a liquid material, and the work processing apparatus further comprises a temperature adjusting device provided for at least one of a yet-to-process work stopping in the processing position and a processed work stopping in the processing position to adjust the temperature of the work.

In the above work processing apparatus, there may be provided a controller that controls the apparatus so that before a work having been processed on one of the work conveyance lines is completely carried out from the processing position, a next to-be-processed work is carried in, and stopped in, the processing position on the other work conveyance line.

In the above work processing apparatus, there may also be provided a controller that controls the apparatus so that before a work stopped in the processing position on one of the work conveyance lines is completely processed, a next to-be-processed work is carried in, and stopped in, the processing position on the other work conveyance line.

Also in the above work processing apparatus, there may be provided a controller that controls the apparatus so that when a work stopped in the processing position on one of the work conveyance lines starts being processed, other work completely processed on the other work conveyance line where the preceding process was done has been stopped in the processing position.

Also in the work processing apparatus according to the present invention, there may be provided at one end of the work conveyance lines a magazine holding device for holding magazines each capable of housing a plurality of works, and a work take-out device configured to take out works from the magazine held by the magazine holding device and supply them to all the work conveyance lines.

Also in the work processing apparatus according to the present invention, there may be provided at one end of the work conveyance lines a magazine holding device for holding magazines each capable of housing a plurality of works, and a work take-up device configured to pick up works from on all the work conveyance lines and house them into the magazine held by the magazine holding device.

Also in the work processing apparatus according to the present invention, there may be provided at one end of the work conveyance lines a magazine holding device for holding magazines each capable of housing a plurality of works, a work take-out device configured to take out works from the magazine held by the magazine holding device and supply them to all the work conveyance lines, and a work take-up device configured to pick up works from on all the work conveyance lines and house them into the magazine held by the magazine holding device.

Also, in the work processing apparatus according to the present invention, there may be provided at both end of the work conveyance lines magazine holding devices for holding magazines each capable of housing a plurality of works, a work take-out device configured to take out works from the magazine held by the magazine holding device and supply them to all the work conveyance lines, and a work take-up device configured to pick up works from on all the work conveyance lines and house them into the magazine held by the magazine holding device.

In the above work processing apparatus, the work take-out device or work take-up device may be provided for each of the work conveyance lines and the magazine holding device be adapted to be so movable that works are taken out by the work take-out device corresponding to each work conveyance line from the magazine held by the magazine holding device or works are picked up by the work take-up device corresponding to each work conveyance line.

Also in the above work processing apparatus, there may be provided a controller to control the apparatus in such a manner that works are sequentially taken out from the magazine held by the magazine holding devices and supplied to the respective work conveyance lines, and works are picked up and housed into the magazine in the same sequence as that in which the works have been supplied to the respective work conveyance lines.

In the above processing apparatus, there may be provided a controller to control the apparatus in such a manner that after a work is picked up from on one of the work conveyance lines and housed into the magazine held by the magazine holding device and before a work is taken out and supplied to the other work conveyance line and picked up from on the latter, a work is taken out to the work conveyance line from the magazine having housed the picked-up work.

Also in the work processing apparatus according to the present invention, there may be provided a controller to control temperature adjustment by the temperature adjusting device.

Also in the work processing apparatus according to the present invention, the process may desirably be an application in which the liquid material is applied from the nozzle to a desired spot on a work and let to flow owing to its fluidity to have a desired state of application.

Also the work processing apparatus according to the present invention may be configured so that a work stopping in the processing position is processed and then let to stay there until the liquid material applied to the work starts flowing and has a desired state, and then carried out from the processing position.

According to another embodiment of the present invention, there is provided a work processing method of making, in a processing apparatus having a plurality of work conveyance lines, a process on a work carried in, and stopped in, a processing position provided in place on each work conveyance line and carrying it out, wherein the process is application in which a liquid material is discharged from a nozzle, and the process is sequentially made by the same processing device on each work conveyance line and, before a work completely processed on one of the work conveyance lines is completely carried out from the processing position, other work is carried in, and stopped in, a processing position on the other work conveyance line where a next process is to be processed, and further at least one of a yet-to-process work stopping the processing position and a processed work stopping in the processing position is subjected to temperature adjustment.

The above work processing method may be adapted so that before a work stopped in the processing position on one of the work conveyance lines is completely processed, a next another work is carried in, and stopped in, the processing position on the other work conveyance line on which a next work is to be processed.

Also the above work processing method may be adapted so that when a work stopped in the processing position on one of the work conveyance lines starts being processed, a preceding work completely processed in the processing position on the other work conveyance line is stopped in the processing position.

Also the above work processing method may be adapted so that works are sequentially taken out from a magazine housing a plurality of works to the respective work conveyance lines, and the works are picked up from on the respective work conveyance lines and housed into the magazine in the same sequence as that in which the works have been taken out.

Also the above work processing method may be adapted so that the work is carried out from a side from which it was carried in and it is housed into the magazine from which it was taken out.

Also the above work processing method may be adapted so that after a work is picked up from on one of the work conveyance lines and housed into the magazine and before another work is taken out to the other work conveyance line and housed, a new work is taken out to the work conveyance line from the magazine having housed that taken-up work.

Also the work processing method according to the present invention may be adapted so that the process is application in which a liquid material is applied from a nozzle to a desired spot on a work and flows owing to its fluidity to have a desired state of application, and the work stopping in the processing position is processed and then let to stay there until the liquid material applied to the work starts flowing and has a desired state, and then carried out from the processing position.

Further the processing method according to the present invention may be adapted so that for making, in a work processing apparatus having a plurality of work conveyance lines, a process on a work in a processing position provided in place on each of the work conveyance lines, a work completely processed on one of the work conveyance lines is carried out from the processing position, and a new to-be-processed work is carried in to the processing position, after the process on said one work conveyance line is complete and before the process on a work on said one work conveyance line is started again after completion of the process on works on all the other work conveyance lines.

For example, in case the processing apparatus has four work conveyance lines (Nos. 1, 2, 3 and 4), works are processed on the work conveyance lines Nos. 1, 2, 3, 4. 1, . . . in this order. Namely, the sequence of processes is such that a work is processed on the conveyance line No. 1, then works are processed on all the conveyance line Nos. 2, 3 and 4, the processed work is carried out from the conveyance line No. 1, and then a new work is carried in to the conveyance line No. 1.

According to the present invention, a work can completely be carried in to the other work conveyance line before a work processed on one of the work conveyance lines is completely carried out from the processing position, so that the time from completion of a process until a next process can be reduced.

Also, since the apparatus is adapted so that the processing device can be moved between the work conveyance lines, the processing may not be provided for each of the work conveyance lines, which leads to a size reduction of the processing apparatus.

BRIEF DESCRIPTION OF THE DRAWINGS

FIG. 4 schematically illustrates a work conveyance rail using an endless belt.

FIGS. 5(a) to 5(f) explain operations of the liquid application apparatus.

FIGS. 6(a) to 6(g) explain operations of the liquid application apparatus.

FIG. 7 is a front view of another example of the liquid application apparatus as the processing apparatus according to the present invention.

BEST MODE FOR CARRYING OUT THE INVENTION

Figure 1:
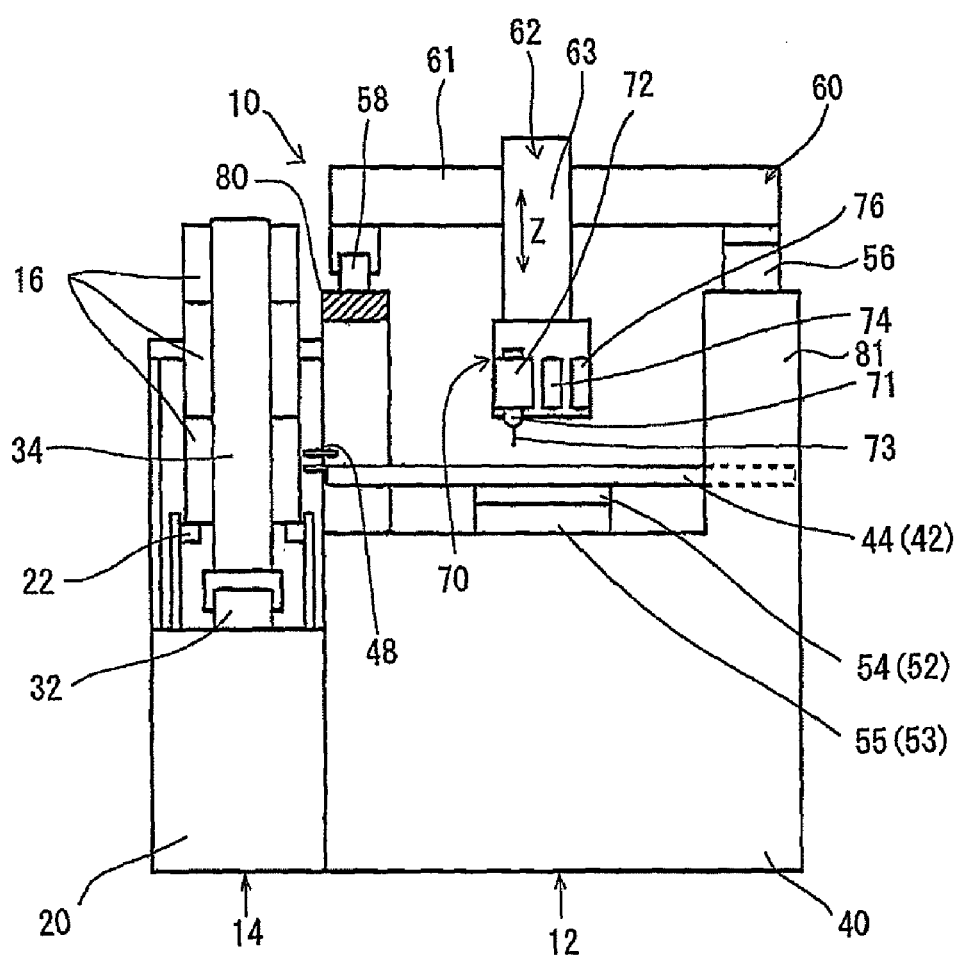
FIG. 1 is a front view of an example of the liquid application apparatus as the processing apparatus according to the present invention.

The present invention will be described in detail hereunder concerning various embodiments thereof with reference to the accompanying drawings.

FIGS. 1 to 4 show an example of the liquid application apparatus as the processing apparatus according to the present invention.

Note that in the drawings, the direction in which the work conveyance rails extend longitudinally is taken as "X-direction", the direction in which the work conveyance rails extend laterally is taken as "Y-direction" and the direction perpendicular to the X- and Y-directions is taken as "Z-direction".

In the drawings, the liquid application apparatus is generally indicated with a reference numeral 10. The liquid application apparatus 10 includes a processing section 12 in which a work A is to be applied and a loading/unloading section 14 that feeds a magazine 16 housing works A to the processing section 12 and takes that magazine 16 away from the processing section 12. The processing section 12 and loading/unloading section 14 are disposed side by side in the X-direction.

Figure 3:
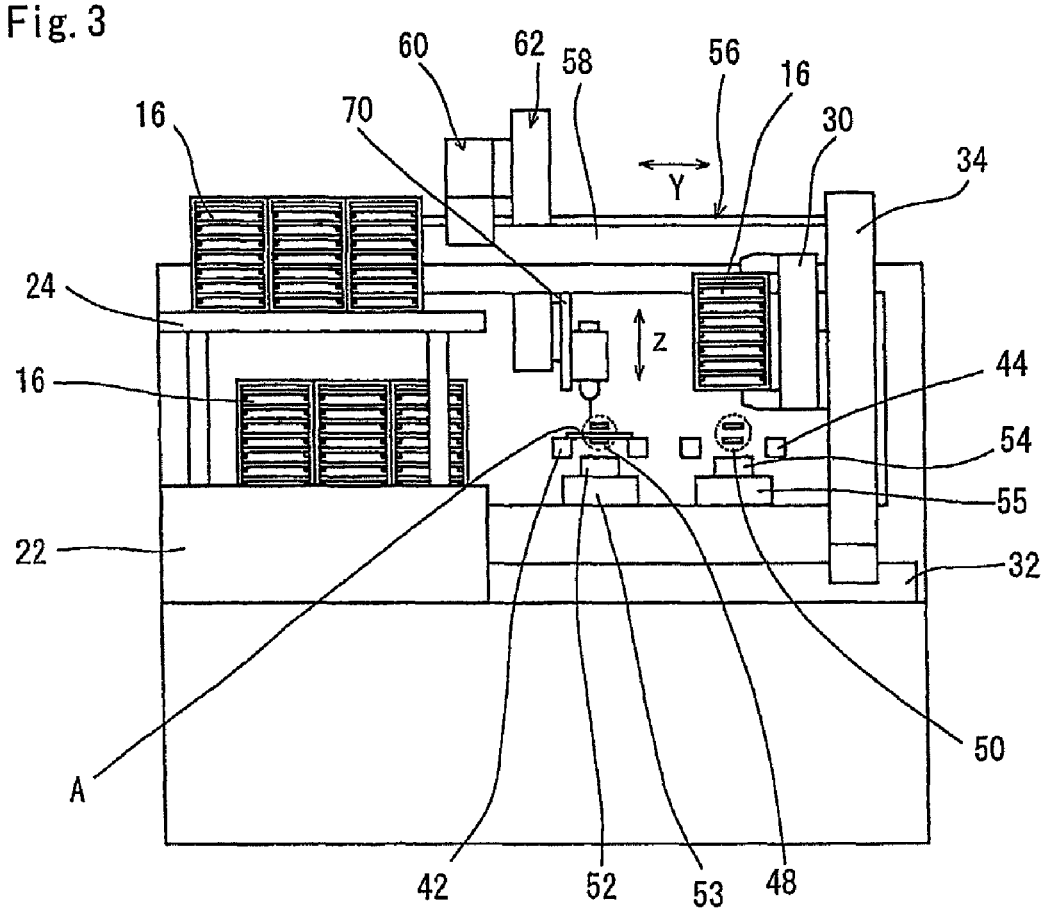
FIG. 3 is a side elevation of the liquid application apparatus in FIG. 1.

The loading/unloading section 14 includes a main body as a base. As shown in FIG. 3, the main body of the loading/unloading section 14 has provided on the top rear portion thereof a magazine conveyance rail set 22 and magazine holding stage 24. The magazine conveyance rail set 22 are to feed a magazine 16 that houses a work A going to be processed to the liquid application apparatus 10. The conveyance rail set 22 includes Y-directionally extending rails and a belt (not shown) put on the rails in the same direction of the rails. As the belt is rotated by a driving unit (not shown), the magazine 16 is moved from rear to front on the magazine conveyance rail set 22. The magazine holding stage 24 is located above the magazine conveyance rail set 22. A magazine 16 in which a processed work A has been housed is placed on the magazine holding stage 24.

Figure 2:
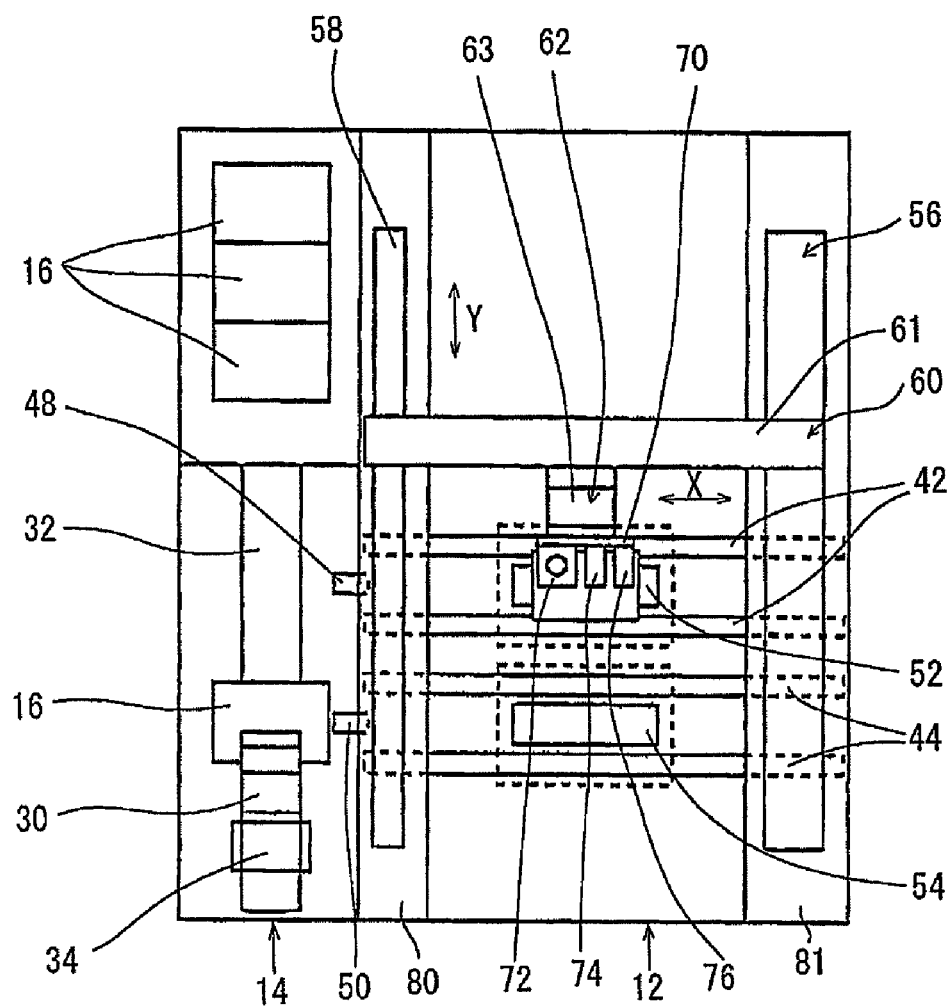
FIG. 2 is a plan view of the liquid application apparatus in FIG. 1.

As on the top front portion of the loading/unloading section 14, there is provided a magazine damper 30 having a pair of claws, upper and lower, and capable of holding a magazine 16 with the claws being applied to the magazine 16 from above and below as shown in FIGS. 2 and 3. The magazine damper 30 is movable by a magazine damper elevator 34 in the Z-direction, and the magazine damper elevator 34 is movable in the Y-direction by a magazine damper Y-directionally moving unit 32. That is, the magazine damper 30 is freely movable in the Y-Z plane by the magazine damper elevator 34 and magazine damper Y-directionally moving unit 32. Therefore, a magazine 16 is movable, while being held by the pair of claws of the magazine damper 30, to a desired position in the Y-Z plane by the magazine damper Y-directionally moving unit 34 and magazine damper elevator 32.

The processing section 12 has a main body 40 as a base in which a first work conveyance rail set 42 including two X-directionally extending rails separate a predetermined distance from each other and a second work conveyance rail set 44 also including two X-directionally extending rails separated a predetermined distance from each other. These first and second work conveyance rail sets 42 and 44 are separated from each other in the Y-direction, and each of them forms a work conveyance line.

In this embodiment, the two work conveyance lines are formed from the first and second work conveyance rail sets, respectively, each including a pair of rails. It should be noted however that a single work conveyance rail set may be formed from a single rail and the two work conveyance line be formed from two such work conveyance rails, respectively. Otherwise, "one work conveyance line" may be formed from a means or track capable of moving one work without using the rails.

As schematically illustrated in FIG. 4, each of the work conveyance rail sets 42 and 44 has a roller 47 provided at either end of the rail (only one end is shown in FIG. 4). As shown, the roller 47 is fixed to the inner side of one rail opposite to the inner side of the other rail. An endless belt 46 is extended between the rollers 47 at opposite ends of the rail. A work A is placed on the two endless belts 46. The rollers 47 and endless belts 46 are rotated by a driving unit (not shown) connected to the rollers 47. The work A is thus moved in the X-direction on the work conveyance rails.

Note that since this embodiment is so arranged that only one work is moved at a time on one work conveyance line, one work conveyance line includes the endless belts in pair with one driving unit. More than one driving unit and more than one pair of endless belts may be used for one work conveyance line as necessary.

At the end of the loading/unloading section 14 for each of the first and second work conveyance rail sets 42 and 44, there are provided first and second work dampers 48 and 50 for holding, fixing and moving a work A.

Each of the work dampers 48 and 50 includes claws to clamp and hold a work A and a member (not shown) to move the claws in the X-direction. Because of such a construction of the work clampers, each of the work dampers 48 and 50 can take a work A out of a magazine 16 positioned at the end of each of the work conveyance rail sets 42 and 44 and places it on the work conveyance rail set (42/44) in the vicinity of the end of the loading/unloading section. Further, the work damper (48/50) can pick up the work A on the work conveyance rail set (42/44) in the vicinity of the end of the loading/unloading section into the magazine 16 positioned at the end of the work conveyance rail set (42/44). This embodiment is so arranged that a single work damper (48/50) takes out a work A and houses the work A into the magazine 16.

Nearly at the middle of the work conveyance rail set (42/44), there is provided a processing position (indicated as a dashed-line block) where a work A is to be processed (applied). When a work A arrives at the processing position, the driving unit for each work conveyance rail set (42/44) and the endless belts 46 serve also as stopping device by turning off the driving unit to stop the endless belts 46 from rotating. Also, a work fixing member (not shown) is provided in the processing position. When a work A having been carried on each work conveyance rail set (42/44) is stopped in the processing position, the work fixing member fixes and holds the work A in the processing position against misalignment in all the X-, Y- and Z-directions.

Also, first and second heaters 52 and 54 (which are to adjust the work temperature) are provided below the work conveyance rail sets 42 and 44 and in positions corresponding to the processing positions. The heaters 52 and 54 are provided on elevators 53 and 55, respectively. When a work A is fixed and held in the processing position, the heater 52 or 55 is elevated into touch with the bottom of the work A to heat the work A to a desired temperature.

In an upper portion of the processing section 12, there are provided an application head 70 having fixed and held thereon a part of the applicator for processing the work A, and a mechanism to move the application head 70 freely in the X-, Y- and Z-directions, for example, a three-axis control robot.

The three-axis control robot includes, for example, a Z-directionally moving unit 62 including a Z-directionally extending arm 63 and which moves the application head 70 in the Z-direction along the arm 63, an X-directionally moving unit 60 including an X-directionally extending arm 61 and which moves the Z-directionally moving unit 62 in the X-direction along the arm 61, a Y-directionally extending guide rail 58, a Y-directionally moving unit 56 that moves the X-directionally moving unit 60 in the Y-direction on the guide rail 58, and a controller (not shown) that controls the Z-directional movement of the application head 70, X-directional movement of the Z-directionally moving unit 62 and Y-directional movement of the X-directionally moving unit 60 according to a preset coating program so that an applicator fixed on the application head 70 can discharge a liquid to a desired spot on a work A.

More specifically, the Z-directionally moving unit 62 includes the Z-directionally extending arm 63, a member to support the application head 70 slidably up and down along the arm 63, and a driving unit (not shown) to move the application head 70. The application head 70 is driven by the driving unit to move up and down (in the Z direction).

Also, the X-directionally moving unit 60 includes the X-directionally extending arm 61, a member to support the Z-directionally moving unit 62 horizontally slidably along the arm 61, and a driving unit (not shown) to move the Z-directionally moving unit 62. The Z-directionally moving unit 62 is driven by the driving unit to move horizontally (in the X-direction).

Further, the Y-directionally moving unit 56 includes a member (not shown) to support the X-directionally moving unit 60 slidably in the Y-direction in relation to the Y-directionally extending guide rail 58 and a driving unit (not shown) to move the X-directionally moving unit 60. The X-directionally moving unit 60 is driven by the driving device to move in the Y-direction.

The guide rail 58 is provided on an arch 80 provided at one end, on the side of the loading/unloading section 14, of the processing-section main body 40 and across the work conveyance lines 42 and 44. The Y-directionally moving unit 56 is provided on an arch 81 provided at the other end, opposite to the loading/unloading section 14, of the processing-section main body 40 and also across the work conveyance lines 42 and 44. The X-directionally moving unit 60 is moved over the work conveyance line 42 by the Y-directionally moving unit 56 and guide rail 58.

More particularly, one end of the X-directionally moving unit 60 is on the Y-directionally moving unit 56. The Y-directionally moving unit 56 is driven to move the X-directionally moving unit 60 in the Y-direction. Also, the X-directionally moving unit 60 has the other end thereof positioned on the guide rail 58 and thus slidable in the Y-direction. That is to say, as the Y-directionally moving unit 56 is driven to move the one end of the X-directionally moving unit 60 in the Y-direction, the X-directionally moving unit 60 will has the other end slid on the guide rail 58, so that it moves in the Y-direction without being misaligned.

Namely, the application head 70 can be moved to a desired position in the X-, Y- and Z-directions by operating the Y-, X- and Z-directionally moving units 56, 60 and 62.

Note that the X-, Y and Z-directionally moving units 60, 56 and 62 may include, for example, a ball screw or linear motor. Also, the X-directionally moving unit 60 may be moved by two Y-directionally moving units including another Y-directionally moving unit instead of the guide rail 58. The second Y-directionally moving unit may include a ball screw or linear motor similarly to the Y-directionally moving unit 56. Also, the second Y-directionally moving unit may be controlled independently of the Y-directionally moving unit 56. In this case, the X-directionally moving unit 60 may also be inclined and the moving direction of the Z-directionally moving unit 62 be changed.

In this embodiment, the application head 70 has attached thereto a holder 72 which holds a syringe 71 retaining a liquid, a laser displacement sensor 74 and a camera 76.

The syringe 71 held by the holder 72 has a nozzle 73 at the lower end thereof and is connected at the upper end thereof to a dispenser via a tube (not shown). Air under a desired pressure is supplied from the dispenser to the syringe 71 through the tube to discharge the liquid retained in the syringe 71 from the nozzle 73.

Detecting laser light emitted from a laser source and reflected at the surface of a work A to be processed, the laser displacement sensor 74 measures a distance to the work A. Also, the camera 76 is used to image the work A in the processing position for detecting the status of the work A.

How the liquid application apparatus as an example of the processing apparatus according to the present invention is used to apply a liquid to a work A will be explained below with reference to FIGS. 5 and 6.

Basically in this embodiment, a work A is carried in to each work conveyance rail set (42/44), processed and carried out. Each of these operations will first be described separately for convenience of explanation.

(1) Carrying in a Work

A work A is placed nearly on the end, on the side of the loading/unloading section 14, of the work conveyance rail set (42/44). As the belts 46 of the work conveyance rail set (42/44) is driven, the work A is carried on the work conveyance rail set (42/44) from the end of the loading/unloading section 14 toward the processing position. When the work A arrives at the processing position, the belt 46 is stopped and the work A is positioned and fixed by a fixing member (not shown).

In this work carrying-in operation, the corresponding heater (52/54) is elevated from below the work A into touch with the work bottom to heat the work A (this heating will be referred to as "pre-heating" hereunder).

(2) Processing the Work

The X-, Y- and Z-directionally moving units 60, 56 and 62 are operated to move the nozzle 73 on the application head 70 to a desired position on the work A and air is supplied from the liquid application apparatus into the syringe 71 to discharge a liquid from the nozzle 73, thereby making a desired application such as underfill or filling. The application had 70 is moved in the X-, Y or Z-direction as necessary by driving the X-, Y- and Z-directionally moving units 60, 56 and 62 during the discharging as well. In this operation, it is possible to reflect, on the application operation, a distance to the surface of the work A, measured by the laser displacement sensor 74, and a status of the work A analyzed based on a work-A image captured by the camera 76.

In the work processing operation, the heater (52/54) is in touch with the bottom of the work bottom to heat the work A for increasing the fluidity of the liquid-applied work A (this will be referred to as "main heating" hereunder).

(3) Carrying out the Work

After the heater (52/54) is lowered to leave the work A, the work A is not fixed any longer in position by the fixing member and then the endless belt 46 of the work conveyance rail set (42/44) is driven in a direction opposite to the direction in which the work A is carried in to the processing position, the work A is moved from the processing position toward the end of the work conveyance rail set (42/44) which is on the side of the loading/unloading section 14. When the work A arrives at near the end of the work conveyance rail set (42/44), the belt 46 stops being driven and thus the work is stopped.

In the work carrying-out operation, the work A in the processing position stays there for a certain time before the heater (52/54) is lowered to leave the work A, the work A is heated by the heater (52/54) also after the processing operation is made (this heating will be referred to as "after-heating" hereunder).

Next, how the liquid is applied to the work by the liquid application apparatus will be explained.

First, the following operations are made as follows to take a work A out of the magazine 16 containing the works A onto the work conveyance rail set (42/44).

Namely, a magazine 16 containing the work A going to be processed is moved from rear to front on the magazine conveyance rail set 22. The magazine damper elevator 34 and magazine damper Y-directionally moving unit 32 are driven to position the magazine damper 30 on the front end portion of the magazine conveyance rail set 22 and the magazine 16 is clamped and held between the claws of the magazine damper 30. Then, the magazine damper elevator 34 and magazine damper Y-directionally moving unit 32 are driven to position the magazine 16 on the end portion of the work conveyance rail set.

Thereafter, a work A is taken out of the magazine 16 for application. The application will be explained below with reference to FIGS. 5 and 6 (showing operations made in steps 1 to 13).

Step 1:

The first work damper 48 takes out a yet-to-process work (work A) from the magazine 16 and places it onto the first work conveyance rail set 42. See FIG. 5(a).

Step 2:

At the first work conveyance rail set 42, the work A is carried into place and subjected to the pre-heating. The magazine 16 is moved to near the end of the second work conveyance rail set 44. The magazine 16 is moved by the magazine damper elevator 34 and magazine damper Y-directionally moving unit 32. See FIG. 5(b).

Step 3:

At the first work conveyance set 42, the application head 70 is moved onto the processing position (namely, work A) to process, and make the main heating of, the work A. The application head 70 is moved by the X-, Y- and Z-directionally moving units 60, 56 and 62.

At the second work conveyance set 44, the second work damper 50 takes out a yet-to-process work (work B) from the magazine 16 and places it onto the second work conveyance rail set 44. See FIG. 5(c).

Step 4:

At the first work conveyance rail set 42, the work A is continuously processed and subjected to the main heating.

At the second work conveyance rail set 44, the work B is carried into place and subjected to the pre-heating.

The magazine 16 is moved to near the end of the first work conveyance rail unit 42. See FIG. 5(d).

Step 5:

At the first work conveyance rail set 42, the work A is subjected to the after-heating.

At the second work conveyance rail set 44, the application head 70 having completed the process at the first work conveyance rail set 42 is moved onto the processing position (namely, work B) on the second work conveyance rail set 44 to process, and make the main heating of, the work B. See FIG. 5(e).

Step 6:

The work A is carried out from on the first work conveyance rail set 42.

At the second work conveyance rail set 44, the work B is continuously processed and subjected to the main heating. See FIG. 5(f).

Step 7:

At the first work conveyance rail set 42, the first work damper 48 picks up the work A having been carried out from on the first work conveyance rail set 42 and houses it into the magazine 16.

At the second work conveyance rail set 44, the work B is continuously processed and subjected to the main heating. See FIG. 6(a).

Step 8:

At the first work conveyance rail set 42, a yet-to-process work (work C) is taken out from the magazine 16 by the first work damper 48 and placed onto the first work conveyance rail set 42.

At the second work conveyance rail set 44, the work B is continuously processed and subjected to the main heating. See FIG. 6(b).

Step 9:

At the first work conveyance rail set 42, the work C is carried in and subjected to the pre-heating.

At the second work conveyance rail set 44, the work B is continuously processed and subjected to the main heating.

The magazine 16 is moved to near the end of the second work conveyance rail set 44. See FIG. 6(c).

Step 10:

At the first work conveyance rail set 42, the application head 70 having completed the process at the second work conveyance rail set 44 is moved to the processing position (namely, work C) on the first work conveyance rail set 42 to process, and make the main heating of, the work C.

At the second work conveyance rail set 44, the work B is subjected to the after-heating. See FIG. 6(d).

Step 11:

At the first work conveyance rail set 42, the work C is continuously processed and subjected to the main heating.

At the second work conveyance rail set 44, the work B is carried out. See FIG. 6(*e*).

Step 12:

At the first work conveyance rail set 42, the work C is continuously processed subjected to the main heating.

At the second work conveyance rail set 44, the second work damper 50 picks up the work B having completely been processed on the second work conveyance rail set 44 and housed into the magazine 16. See FIG. 6(*f*).

Step 13:

At the first work conveyance rail set 42, the work processing and main heating are continuously done.

At the second work conveyance rail set 44, the second work damper 50 takes out a yet-to-process work (work D) from the magazine 16 and mounts it onto the second work conveyance rail set 44. See FIG. 6(*g*).

After completion of the above operations in steps 1 to 13, the controller goes back to step 4 in which it will repeat the above-mentioned operations. It should be noted that in step 4, the work C is replaced with the work A and work D is with the work B for effecting the subsequent operations.

When all the works in the magazine 16 are processed as above, the magazine damper 30 is driven by the magazine damper elevator 34 and magazine damper Y-directionally moving unit 32 to place the magazine it is holding onto the magazine holding stage 24. Then, the magazine damper 30 holds another magazine 16 on the magazine conveyance rail set 22 and repeats the above operations.

The magazine 16 placed on the magazine holding stage 24 is taken up by a worker or robot (not shown) and sent to a processing post on the production line.

To reduce the time for taking out and housing a work by reducing the distance over which a work is to be moved in this embodiment, a magazine from which a work is to be taken by the work damper is positioned by the magazine damper elevator for a work going to be taken out from the magazine by the work damper to have the bottom thereof set at the same level inside the magazine as the upper surface of the work conveyance rail set. Also, a magazine into which a work is to be housed by the magazine damper is positioned by the magazine damper elevator so that a position inside the magazine where the work is to be housed is set at the same height as the upper surface of the work conveyance rail set.

Through the above operations, a work has already been carried in onto the second work conveyance rail set 44 when the work is completely processed at the first work conveyance rail set 42 and the application head 70 is moved onto the second work conveyance rail set 44. So, the work can readily be processed at the second work conveyance rail set 44.

Similarly, a work has already been carried in onto the first work conveyance rail set 42 when another work is completely processed at the second work conveyance rail set 44 and the application head 70 is moved onto the second work conveyance rail set 44. So, the work can be processed immediately at the first work conveyance rail set 42. That is, processing of the work having arrived at the processing position can be started without waiting, which permits to improve the production efficiency.

In this embodiment, it is necessary that after one work is completely processed and before another work starts being processed, the application head should be moved onto the other work conveyance rail. However, this movement can be done in a rather shorter time than the time after a work is completely processed at one work conveyance rail set and a next work is carried in onto this work conveyance rail set, for the works may not be carried at a high speed because of being are small, delicate and thus fragile.

Also in the processing apparatus according to this embodiment, a limited number of processing units are moved between the work conveyance rail sets. So, even in case the number of work conveyance rail sets used in the embodiment is increased, the apparatus as a whole will not be correspondingly larger.

Also since the plurality of work conveyance rail sets is provided in the apparatus, a work can be let to stay in the processing position both before and after processed, which makes it unnecessary to provide any special wait positions before and after the processing position, respectively. Thus, the efficiency of operation and the entire apparatus can be designed smaller.

Also, since the plurality of work conveyance rail sets makes it unnecessary to provide any wait positions both before and after the processing position, respectively, the work completely processed can be carried out to the side from which that work has been carried in. So, the loading/unloading section may be provided only at one side of the processing section, which makes it possible to design the apparatus smaller than in case a loader and unloader are provided at the opposite sides, respectively, of the processing section.

Also the limited number of heaters contributes to reduced power consumption of the apparatus and less heat staying inside the apparatus. Thus, the influence of the heat on the other mechanical and electronic parts of the apparatus is smaller.

Also in this embodiment, the heater provided only in each processing position can make the main heating of a work being processed, pre-heating of a yet-to-processed work and after-heating of a processed work. In an application in which a liquid material applied from the nozzle to a work flows to have a desired state, such as underfill filling and sealing, a work can be heated by the pre-heating to reach a temperature at which the liquid material can easily flow and also a work can be heated by the after-heating to reach a temperature that will promote the flowing of the liquid material applied to the work.

Figure 8:
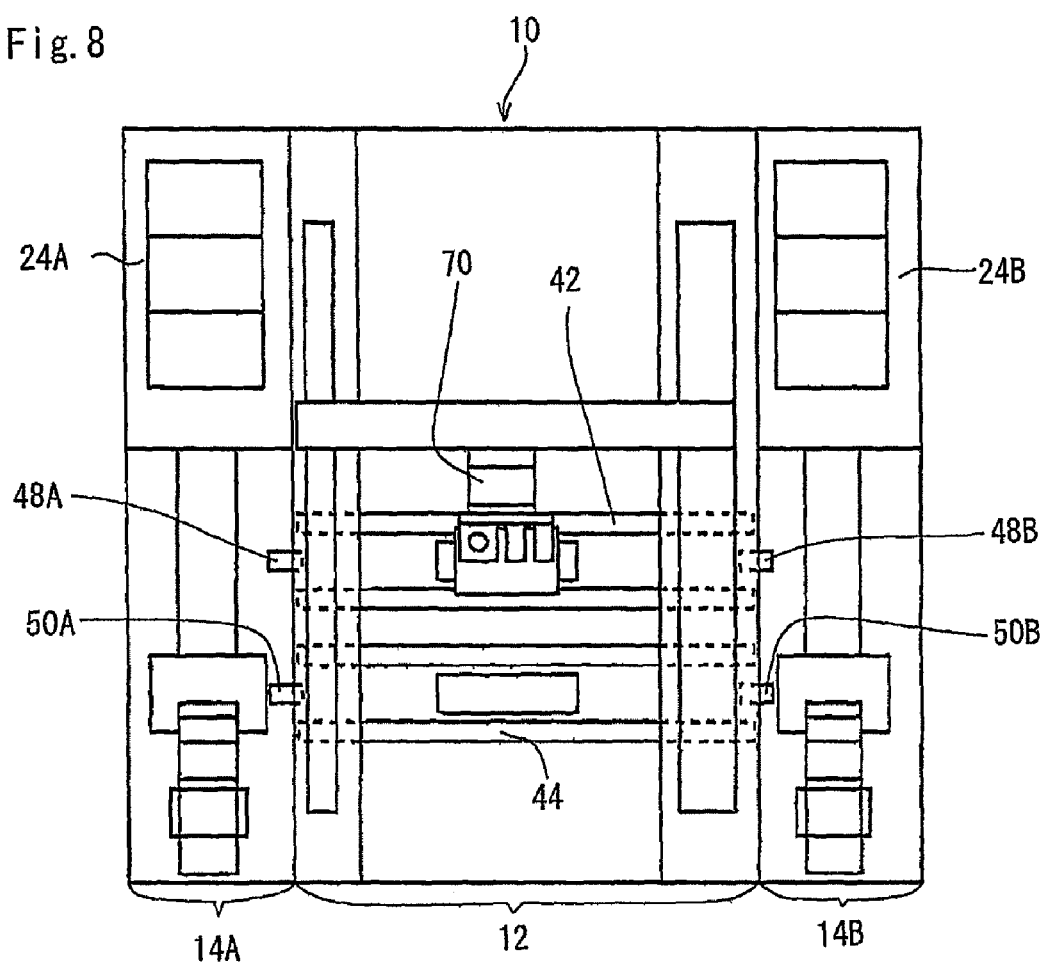
FIG. 8 is a plan view of the liquid application apparatus in FIG. 7.
Figure 9:
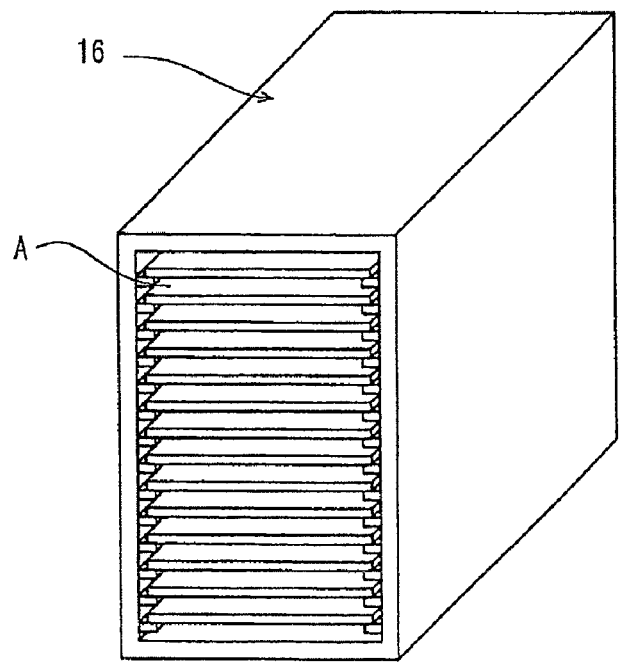
FIG. 9 schematically illustrates a magazine that houses works.
Figure 10:
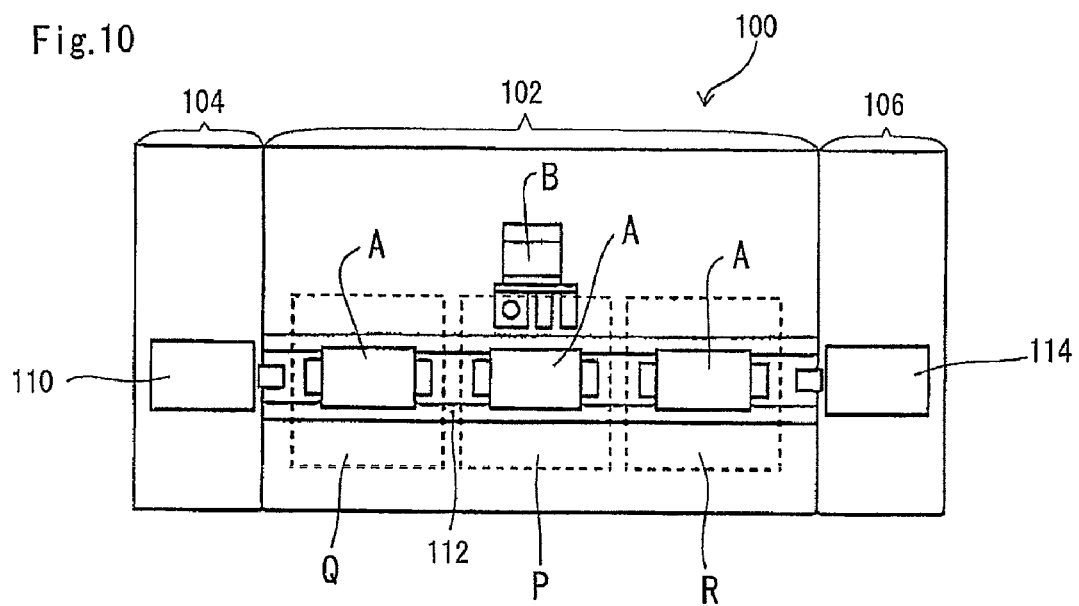
FIG. 10 schematically illustrates a conventional processing apparatus.

FIGS. 7 and 8 show another example of the liquid application apparatus as the processing apparatus according to the present invention.

In this embodiment, a loader 14A and unloader 14B are provided to the left and right, respectively, of the processing section 12 as shown in FIG. 7 (front view).

In this case, a work A completely processed is carried out of the processing position to the side of the unloader 14B opposite to the loader 14A. The work A is housed into the magazine 16 on the unloader 14B by a work damper 48B or 50B (take-up unit) provided at the end, on the side of the unloader 14B, of the work conveyance rail set 42 or 44.

It should be noted that the loader 14A and unloader 14B are constructed similarly to the loading/unloading section 14 in the first embodiment.

The loader 14A has carry-in work dampers 48A and 50A (take-out unit) any of which carries a magazine 16 containing yet-to-process works from a magazine conveyance rail set 22A. The loader 14A has also a magazine holding stage 24A onto which an empty magazine from which works have been carried out is placed.

The empty magazine is carried on a magazine conveyance rail set 22B to the unloader 14B. The loader 14B has also a magazine holding stage 24B onto which a magazine 16 in which processed works have been housed is placed.

In the first embodiment, the magazine damper 30 of the loading/unloading section 14 has to hold a magazine 16 from which a last work has been taken out until the work is completely processed and returns to that magazine. So, the magazine damper 30 cannot place the empty magazine 16 on the magazine holding stage 24 and receive any new magazine 16 in which a yet-to-process work is picked up from on the magazine conveyance rail set 22.

Thus, no other work can be supplied for a while to the work conveyance rail set 42 or 44 until the last work completely processed returns to the magazine 16.

In the second embodiment, however, a work taken out of the magazine 16 on the loader 14A is housed into another magazine 16 on the unloader 14B. Immediately after all works have been taken out of the magazine 16 on the loader 14A, the magazine damper 30 of the loader 14A can place an empty magazine 16 it is holding onto the magazine holding stage 24A and hold another magazine having housed an yet-to-process work picked up from on the magazine conveyance rail set 22A.

Therefore, works can be supplied continuously onto the work conveyance rail set 42 or 44, which further improves the production rate.

The aforementioned first and second embodiments of the present invention adopt, as the work conveyance lines, the work conveyance rail sets 42 and 44 having a conveyance mechanism using the belts 46. However, the present invention is not limited to such work conveyance rail sets but may use a mechanism to move a work holding table by a ball screw in the X-direction or a mechanism to move a work in the X-direction while clamping a part of the work.

Heaters are used to adjust the work temperature. However, the present invention may use a cooler or a combination of a heater and cooler as necessary.

In the aforementioned embodiments, the liquid application apparatus with a nozzle is used as a processing device. However, the present invention is not limited to such a liquid application apparatus but may use a device that places a device on a work, a device that machines and cuts a work or the like.

Also, as a take-out unit to move a work from a magazine onto a work conveyance rail set, there may be used a push-out unit that moves a work onto the work conveyance rail set by pushing the work at the rear end from a side of the magazine opposite to the work conveyance rail set in place of the work clamper. Also, as the take-up unit, there may be used a push-out unit that moves a work into a magazine by pushing the work at the rear end. Also, as the take-out unit and take-up unit, there may be used a unit that moves a work with claws hooked in holes or concavities in the work.

According to another embodiment of the present invention, there is also provided a liquid application apparatus that may preferably include an application head unit with a nozzle which discharges a liquid, a work housing unit to house works, and a work conveyance unit provided below the application head to carry a work supplied from the work housing unit to a position where it is to be applied by the application head and also carry the work completely applied to the work housing unit. The application head may preferably include an application head having the nozzle to discharge the liquid material, a vertically moving unit to move the application head vertically, a first moving unit having a beam to move the vertically moving unit in a first direction in which the beam extends, and a second moving unit extended in a second direction different from the extending direction of the beam to move the beam in the second direction. The work conveyance mechanism may preferably include two or more conveyance lines for conveying the work.

In the above liquid dispenser, the work housing unit should desirably be provided at one end of the work conveyance unit.

Also, the liquid dispenser may preferably include a heating/cooling unit provided below the work conveyance unit in the coating position to heat or cool the work.

Further, the first direction may desirably be the same as the extending direction of the work conveyance line.

Note that in the processing apparatus according to the present invention, the operations of the drive for each member, adjusting units for the heater, dispenser and the like, and various sensors are controlled with signals being transferred between them and the controller (not shown). The controller may be a well-known one normally used in this field of industry, and is not limited in construction and arrangement so long as it controls the above members to operate as desired.

The controller used in the present invention may be formed from an electronic circuit, for example. It may be formed from control circuits provided for the above members to send and receive signals between them, a single control circuit adapted to control the members by sending and receiving signals to and from the members or a combination of such control circuits.

Also the controller may mainly be a personal computer or the like or an electronic circuit board installed inside the cabinet of the processing apparatus.

Also, how each of the members is to be controlled may be determined by hardware such as an electronic circuit or software such as a program. It may be changed by changing only the software such as a program with the hardware being left unchanged.

Also, the controller may be provided with an input unit to make entry of how each member is to be controlled, etc. and a display unit to show the result of control, as necessary.

Industrial Applicability

As having been described in the foregoing, the present invention proposes a processing apparatus and method improved in production rate, the apparatus being reducible in size. It is not applicable only to the liquid application apparatus with a nozzle but also to an apparatus that places parts on a work and an apparatus by which a work is machined or cut.

The invention claimed is:

1. A work processing apparatus comprising:
   a plurality of work conveyance lines on which works are to be moved;
   a stopping device for stopping a work in a predetermined processing position on each of the work conveyance lines;
   a processing device for making a desired process on the work stopped by the stopping device, the processing device including an applicator having a nozzle that discharges a liquid material to a desired spot on a work and let to flow owing to its fluidity to have a desired state of application; and
   a moving device for moving the processing device between the work conveyance lines;
   a temperature adjusting device provided to a corresponding work conveyance line and configured to adjust the temperature of at least one of a yet-to-process work and a processed work stopping in the processing position, wherein the temperature adjusting device provided to the corresponding work conveyance line is provided only in the processing position of the corresponding work conveyance line; and a controller configured to control the apparatus so as to make the processed work stay in the work processing position undergoing the temperature adjustment until the liquid material applied to the work starts flowing and has a desired state.

2. The apparatus according to claim 1, further comprising the controller configured to control the apparatus so that before a work having been processed on one of the work conveyance lines is completely carried out from the processing position, a next to-be-processed work is carried in, and stopped in, the processing position on the other work conveyance line.

3. The apparatus according to claim 1, further comprising the controller configured to control the apparatus so that before a work stopped in the processing position on one of the work conveyance lines is completely processed, a next to-be-processed work is carried in, and stopped in, the processing position on the other work conveyance line.

4. The apparatus according to claim 1, further comprising the controller configured to control the apparatus so that when a work stopped in the processing position on one of the work conveyance lines starts being processed, other work completely processed on the other work conveyance line where the preceding process was done has been stopped in the processing position.

5. The apparatus according to claim 1, further comprising a magazine holding device provided at one end of the work conveyance lines for holding magazines each capable of housing a plurality of works, and a work take-out device configured to take out works from the magazine held by the magazine holding device and supply them to all the work conveyance lines.

6. The apparatus according to claim 1, further comprising a magazine holding device provided at one end of the work conveyance lines for holding magazines each capable of housing a plurality of works, and a work take-up device configured to pick up works from all the work conveyance lines and house them into the magazine held by the magazine holding device.

7. The apparatus according to claim 1, further comprising a magazine holding device provided at one end of the work conveyance lines for holding magazines each capable of housing a plurality of works, a work take-out device configured to take out works from the magazine held by the magazine holding device and supply them to all the work conveyance lines, and a work take-up device configured to pick up works from all the work conveyance lines and house them into the magazine held by the magazine holding device.

8. The apparatus according to claim 1, further comprising magazine holding devices provided at both ends of the work conveyance lines for holding magazines each capable of housing a plurality of works, a work take-out device configured to take out works from the magazine held by any one of the magazine holding devices and supply them to all the work conveyance lines, and a work take-up device configured to pick up works from all the work conveyance lines and house them into the magazine held by the other magazine holding device.

9. The apparatus according to claim 7, further comprising the controller configured to control the apparatus in such a manner that works are sequentially taken out from the magazine held by the magazine holding device and supplied to the respective work conveyance lines, and works are picked up and housed into the magazine in the same sequence as that in which the works have been supplied to the respective work conveyance lines.

10. The apparatus according to claim 7, further comprising the controller configured to control the apparatus in such a manner that after a work is picked up from one of the work conveyance lines and housed into the magazine held by the magazine holding device and before a work is taken out and supplied to the other work conveyance line and picked up from the latter, a work is taken out to the work conveyance line from the magazine having housed the picked-up work.

11. The apparatus according to claim 1, further comprising a controller configured to control a temperature adjustment by the temperature adjusting device.

12. The apparatus according to claim 1, further comprising:
a vertical moving device for moving the processing device vertically;
a first moving device having an arm extending in a first direction to move the vertical moving device in the first direction; and
a second moving device extending in a second direction different from the first one to move the first moving device in the second direction,
the second direction being at right angles to the extending direction of the work conveyance lines.

13. The apparatus according to claim 12, wherein the second moving device is provided to have a moving range across at least one of the work conveyance lines.

14. The apparatus according to claim 13, further comprising a guide rail to hold the first moving device movably in the second direction.

15. The apparatus according to claim 14, further comprising a third moving device for holding the first moving device movably in the second direction.

16. A work processing method of making, in a processing apparatus having a plurality of work conveyance lines, a process on a work carried in, and stopped in, a processing position provided in place on each work conveyance line and carrying it out, wherein
the process is application in which a liquid material is discharged from a nozzle to a desired spot on a work and flows owing to its fluidity to have a desired state of application, and the process is sequentially made by the same processing device on each work conveyance line and, before a work completely processed on one of the work conveyance lines is completely carried out from the processing position, other work is carried in, and stopped in, a processing position on the other work conveyance line where a next process is to be processed,
providing a temperature adjusting device to a corresponding work conveyance line to adjust the temperature of at least one of a yet-to-process work and a processed work stopping in the processing position, wherein the temperature adjusting device provided to the corresponding work conveyance line is provided only in the processing position of the corresponding work conveyance line, and
further a processed work stopping in the processing position stays in the processing position undergoing the temperature adjustment until the liquid material applied to the work starts flowing and has a desired state.

17. The method according to claim 16, wherein before a work stopped in the processing position on one of the work conveyance lines is completely processed, a next another work is carried in, and stopped in, the processing position on the other work conveyance line on which a next work is to be processed.

18. The method according to claim 16, wherein when a work stopped in the processing position on one of the work conveyance lines starts being processed, a preceding work completely processed in the processing position on the other work conveyance line is stopped in the processing position.

19. The method according to claim 16, wherein works are sequentially taken out from a magazine housing a plurality of works to the respective work conveyance lines, and the works are picked up from the respective work conveyance lines and housed into the magazine in the same sequence as that in which the works have been taken out.

20. The method according to claim 19, wherein the work is carried out from a side from which it was carried in and it is housed into the magazine from which it was taken out.

21. The method according to claim 20, wherein after a work is picked up from one of the work conveyance lines and housed into the magazine and before another work is taken out to the other work conveyance line and housed, a new work is taken out to the work conveyance line from the magazine having housed that taken-up work.

22. A work processing method for making, in a work processing apparatus having a plurality of work conveyance lines, a process on a work in a processing position provided in place on each of the work conveyance lines, wherein the process is application in which a liquid material is discharged from a nozzle to a desired spot on a work and let to flow owing to its fluidity to have a desired state of application, and a work completely processed on one of the work conveyance lines is carried out from the processing position, and a new to-be-processed work is carried in to the processing position, after the process on said one work conveyance line is complete and before the process on a work on said one work conveyance line is started again after completion of the process on works on all the other work conveyance lines, providing a temperature adjusting device to a corresponding work conveyance line to adjust the temperature of at least one of a yet-to-process work and a processed work stopping in the processing position, wherein the temperature adjusting device provided to the corresponding work conveyance line is provided only in the processing position of the corresponding work conveyance line, and further a processed work stopping in the processing position stays in the processing position undergoing the temperature adjustment until the liquid material applied to the work starts flowing and has a desired state.

23. The apparatus according to claim 1, wherein the desired state of the liquid material is a completely spread state.

24. The method according to claim 16, further comprising providing the desired state of the liquid material as a completely spread state.

25. The method according to claim 22, further comprising providing the desired state of the liquid material as a completely spread state.

* * * * *